(12) United States Patent
Cove

(10) Patent No.: US 6,903,605 B2
(45) Date of Patent: Jun. 7, 2005

(54) OFFSET CANCELLATION TECHNIQUES THAT UTILIZE ONE OF A PLURALITY OF OFFSET CANCELLATION SOURCES

(75) Inventor: Stephen E. Cove, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 10/379,972

(22) Filed: Mar. 4, 2003

(65) Prior Publication Data

US 2004/0174210 A1 Sep. 9, 2004

(51) Int. Cl.[7] ............................. H03F 1/02; H03F 1/38; H03F 3/14

(52) U.S. Cl. ............................. 330/9; 330/291; 330/307
(58) Field of Search .............................. 330/9, 291, 307

(56) References Cited

U.S. PATENT DOCUMENTS

| | | | | |
|---|---|---|---|---|
| 5,182,476 A | * | 1/1993 | Hanna et al. | ............... 327/362 |
| 5,821,795 A | * | 10/1998 | Yasuda et al. | ............. 327/307 |
| 6,366,622 B1 | * | 4/2002 | Brown et al. | ............... 375/322 |

* cited by examiner

*Primary Examiner*—Patricia Nguyen
(74) *Attorney, Agent, or Firm*—Glen B. Choi

(57) ABSTRACT

Briefly, DC offset cancellation techniques that utilize one of multiple sources of a DC offset cancellation signal. The DC offset cancellation techniques may be used by a limiting amplifier.

20 Claims, 3 Drawing Sheets

OFFSET CANCELLATION TECHNIQUES THAT UTILIZE ONE OF A PLURALITY OF OFFSET CANCELLATION SOURCES

FIELD

The subject matter disclosed herein generally relates to techniques to reduce DC offset.

DESCRIPTION OF THE RELATED ARTS

It is well known that an input system to a communications system may experience a DC offset at its input terminal(s) that may cause asymmetry among peak voltages of a signal output by the input system. For example, such input system may include a limiting amplifier. Vertical (DC) offset cancellation may be used to adjust the voltage at the input terminals to cancel DC offset.

Two well known techniques to provide DC offset cancellation include on-chip DC offset cancellation and off-chip manually adjustable DC offset cancellation. An on-chip DC offset cancellation device may share the same die or integrated circuit as an input system to a communications system, which may be, in some cases, a limiting amplifier. For example, the on-chip DC offset cancellation device may provide a DC offset voltage having a fixed relationship with a reference signal such as an output signal from an input system to a communications system. An off-chip DC offset cancellation device may not share the same die or integrated circuit as an input system to a communications system. The off-chip DC offset cancellation device may provide a DC offset voltage that may be manually adjustable by a user.

The on chip DC offset cancellation device may utilize less components than the off-chip DC offset cancellation device. The off-chip DC offset cancellation device may provide more flexibility in the DC offset cancellation voltages generated than the on-chip DC offset cancellation device. The off-chip DC offset cancellation device may offset a greater variety of signals (e.g., asymmetrical or smaller amplitude signals) than those of the on-chip DC offset cancellation device. It is desirable to provide DC offset cancellation having advantages of both the on-chip and off-chip DC offset cancellation devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Note that use of the same reference numbers in different figures indicates the same or like elements.

DETAILED DESCRIPTION

Figure 1:
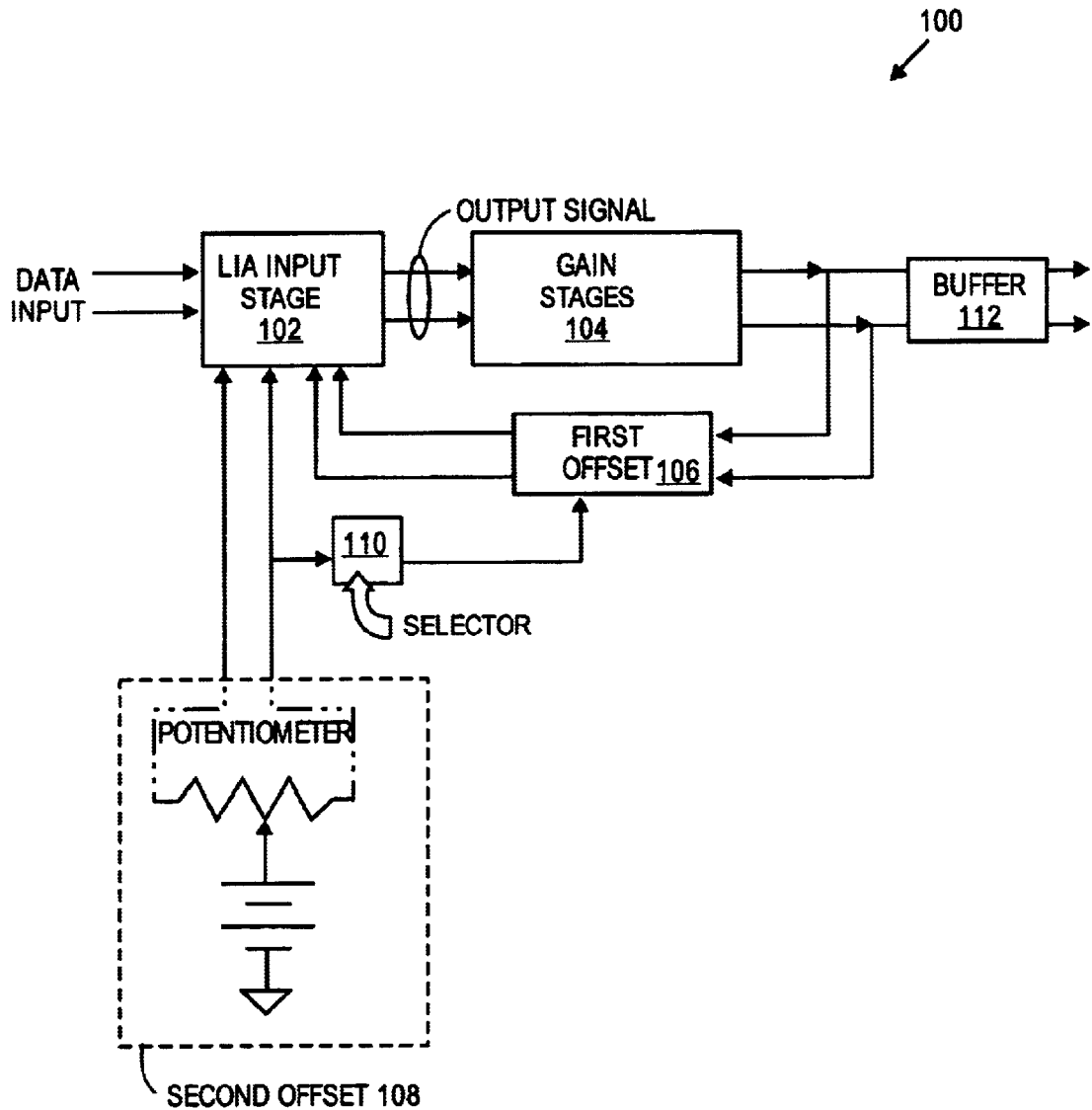
FIG. 1 depicts one possible embodiment of a limiting amplifier in accordance with an embodiment of the present invention.

FIG. 1 depicts one possible embodiment of a limiting amplifier ("LIA") 100, in accordance with an embodiment of the present invention, in which DC offset cancellation may be provided at least by one of multiple sources of DC offset cancellation. LIA 100 may include: LIA input stage 102, gain stages 104, first offset 106, second offset 108, selector 110, and buffer 112. In one implementation, LIA input stage 102, gain stages 104, first offset 106, selector 110, and buffer 112 may be implemented among the same semiconductor die, integrated circuit, or chipset. Second offset 108 may be coupled to such die, integrated circuit, or chipset using conductive leads among a printed circuit board.

Differential input nodes of LIA input stage 102 may receive an input signal (shown as DATA INPUT) as well as a DC offset cancellation voltage from one source among multiple sources of DC offset cancellation voltages. In this example, first offset 106 and second offset 108 may act as sources of DC offset cancellation voltages. In one embodiment, selector 110 may control which source provides a DC offset cancellation voltage to LIA input stage 102. LIA input stage 102 may output a signal having greatly improved DC offset characteristics over those of an uncorrected signal.

Gain stages 104 may increase the current or voltage magnitude of an output signal provided by LIA input stage 102. In one embodiment, gain stages 104 maybe implemented as a differential amplifier. First offset device 106 may receive the amplified output signal from gain stages 104. First offset device 106 may filter a DC average voltage signal from the amplified output signal from gain stages 104. First offset device 106 may provide the DC average voltage signal to LIA input stage 102 as a DC offset cancellation voltage. First offset device 106 maybe implemented as a low pass filter ("LPF") having a band pass limit of approximately 100 kHz although other band pass ranges may be used.

Second offset device 108 may provide a manually tunable DC offset cancellation signal to selector 110 and LIA input stage 102. Second offset device 108 may be implemented as a tunable potentiometer and voltage source. In one implementation, the second offset device 108 may provide a DC offset cancellation signal to LIA input stage 102 using conductive leads on, for example, a printed circuit board.

In some embodiments, selector 110 may prioritize sources of DC offset cancellation so that a higher priority source of DC offset cancellation is favored over a lower priority source. In this example, selector 110 may prioritize second offset 108 over first offset 106. In some embodiments, selector 110 will allow a highest priority source of DC offset cancellation to provide a DC offset cancellation signal and disable outputs of lower priority sources of DC offset cancellation. For example, if any voltage is output by second offset 108, then selector 110 may make the output voltage of first offset 106 equal zero.

Buffer 112 may receive the amplified output signal from the gain stages 104 and transfer the amplified output signal to other functional blocks or devices such as a clock and data recovery device (not depicted). Buffer 112 may provide isolation for the gain stages 104 from the next functional block or device and set a specified output impedance for connection with the next functional block or device.

Figure 2:
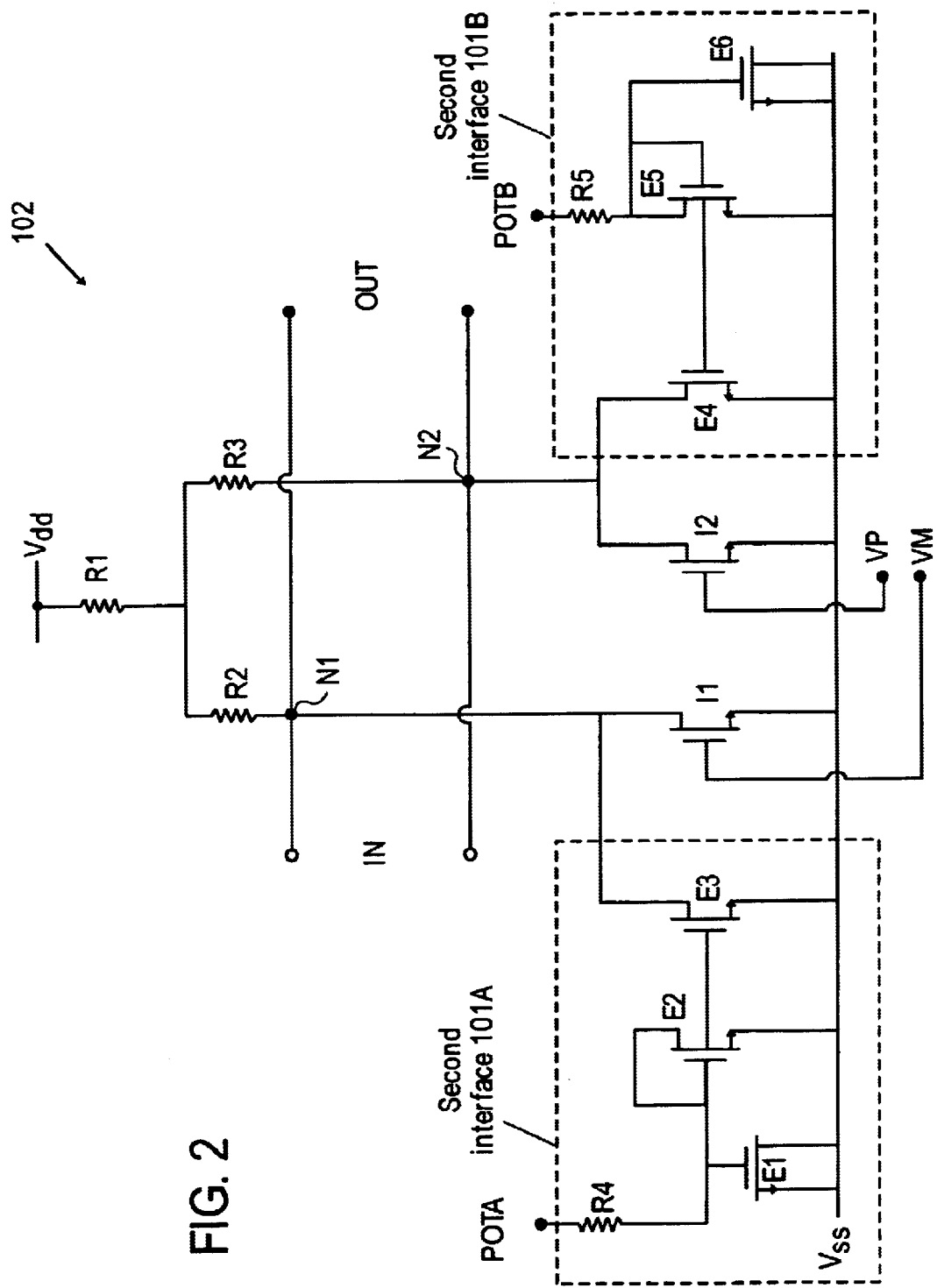
FIG. 2 depicts one possible implementation of a LIA input stage in accordance with an embodiment of the present invention.

FIG. 2 depicts one possible implementation of a LIA input stage 102 in accordance with an embodiment of the present invention. LIA input stage 102 may include resistive elements R1, R2, R3, transistor elements 11 and 12, and second interfaces 101A and 110B. Transistor elements 11 and 12 maybe used to provide DC offset cancellation from first offset 106 whereas second interfaces 101A and 101B may be used to provide DC offset cancellation from second offset 108.

A bias voltage Vdd may be coupled to resistive element R1. Resistive elements R2 and R3 may couple resistive element R1 to respective positive and negative input terminals (which correspond to respective nodes N1 and N2). Nodes N1 and N2 may also provide differential output terminals. In one implementation, the impedance of resistive elements R2 and R3 may be the same.

Transistor elements I1 and I2 may be implemented as negative-channel metal-oxide semiconductor (NMOS) transistors although other devices may be used. Drain terminals of transistor elements I1 and I2 may be coupled to respective nodes N1 and N2. Terminals VM and VP may be coupled to gate terminals of transistor elements I1 and I2. Terminals VM and VP may receive a differential signal from first offset 106. Source terminals of transistor elements I1 and I2 may be coupled to bias voltage Vss.

A bias voltage Vss may be set at approximately ground level or a lower voltage level than that of Vdd. Bias voltage Vss may be used to provide a lower voltage bias for transistor elements I1 and I2 and second interfaces 101A and 101B.

The following is a description of a possible manner that LIA input stage 102 may use a DC offset cancellation provided by first offset 106. First offset 106 may provide a differential voltage to terminals VM and VP. When no voltage is provided to terminal VM or VP, then first offset 106 provides no DC offset cancellation. When voltages at terminals VM and VP are equal, then gate terminals of transistor elements I1 and I2 are biased to the same voltage and currents through transistor elements I1 and I2 may be the same under ideal conditions. Accordingly, no DC offset cancellation may be provided across terminal IN.

When a voltage at terminal VM is higher than at terminal VP, then a voltage at the gate terminal of transistor element I1 is higher than that of transistor element I2. Under ideal conditions, current through transistor element I1 will be greater than that through transistor element I2. A higher voltage drop occurs through resistive element R2 than through resistive element R3. Accordingly, the voltage at node N2 will be greater than that at node N1. The difference between voltages at nodes N1 and N2 may cancel DC offset.

When a voltage at terminal VP is higher than at terminal VM, then a voltage at the gate terminal of transistor element I2 is higher than that of transistor element I1. Under ideal conditions, current through transistor element I2 will be greater than that through transistor element I1. A higher voltage drop occurs through resistive element R3 than through resistive element R2. Accordingly, the voltage at node N1 will be greater than that at node N2. The difference between voltages at nodes N1 and N2 may cancel DC offset.

Referring next to second interfaces 101A and 101B. Second interface 101A may include transistor elements E1, E2, and E3 as well as resistive element R4. Second interface 101B may include transistor elements E4, E5, and E6 as well as resistive element R5. Transistor elements E1 to E6 may be implemented as negative-channel metal-oxide semiconductor (NMOS) transistors although other devices may be used. In one implementation, the impedance of resistive elements R4 and R5 may be the same. Transistor elements I1, I2, and E1 to E6 may have the same gain characteristics although they do not have to have the same gain characteristics.

The following is a description of a possible implementation of second interface 101A. Transistor element E2 may be configured in a diode formation so that its drain terminal is coupled to its gate terminal. Transistor elements E2 and E3 may be configured in a current mirror configuration. For example, a gate terminal of transistor element E2 may be coupled to a gate terminal of transistor E3. Source terminals of transistor elements E2 and E3 may be coupled to bias voltage Vss. A drain terminal of transistor element E3 may be coupled to a drain terminal of transistor element I1. A resistor R4 may couple a signal at node POTA to a gate terminal of transistor element E2. A gate terminal of transistor element E1 may be coupled to a gate terminal of transistor element E2. Drain and source terminals of transistor element E1 may be coupled to bias voltage Vss.

The following is a description of a possible implementation of second interface 101B. Transistor element E5 may be configured in a diode formation so that its drain terminal is coupled to its gate terminal. Transistor elements E4 and E5 may be configured in a current mirror configuration. For example, a gate terminal of transistor element E5 may be coupled to a gate terminal of transistor E4. Source terminals of transistor elements E4 and E5 may be coupled to bias voltage Vss. A drain terminal of transistor element E4 may be coupled to a drain terminal of transistor element I2. A resistor R5 may couple a signal at node POTB to a gate terminal of transistor element E5. A gate terminal of transistor element E6 may be coupled to a gate terminal of transistor element E5. Drain and source terminals of transistor element E6 may be coupled to bias voltage Vss.

The following is a description of a possible manner that LIA input stage 102 may use a DC offset cancellation provided by second offset 108. Second offset 108 may provide voltages to nodes POTA and POTB of respective second interfaces 101A and 101B. When no voltage is provided at node POTA or POTB, then second interfaces 101A and 101B may not operate. When voltages at nodes POTA and POTB are equal, then gate terminals of transistor elements E2, E3, E4, and E5 are biased to the same voltage and currents through transistor elements E3 and E4 may be the same under ideal conditions. Hence, LIA input stage 102 transfers no DC offset cancellation voltage across nodes N1 and N2 from second offset 108.

When a voltage at node POTA is greater than at node POTB, then a voltage at the gate terminals of transistor elements E2 and E3 is higher than that of gate terminals of transistor elements E4 and E5. Under ideal conditions, current through diode connected transistor element E2 will be higher than that through diode connected transistor element E5. Current through the source terminal of transistor element E3 mirrors current through the source terminal of transistor element E2. Similarly, current through the source terminal of transistor element E4 mirrors current through the source terminal of transistor element E5. A higher voltage drop occurs through resistive element R2 than through resistive element R3. Accordingly, the voltage at node N2 will be greater than that at node N1 to provide a differential DC offset cancellation voltage among nodes N1 and N2. Such differential DC offset cancellation voltage among nodes N1 and N2 may cancel DC offset.

When a voltage at node POTB is greater than at node POTA, then a voltage at the gate terminals of transistor elements E4 and E5 is higher than that of gate terminals of transistor elements E2 and E3. Under ideal conditions, current through diode connected transistor element E5 will be higher than that through diode connected transistor element E2. Current through the source terminal of transistor element E4 mirrors current through the source terminal of transistor element E5. Similarly, current through the source terminal of transistor element E3 mirrors current through the source terminal of transistor element E2. A higher voltage drop occurs through resistive element R3 than through resistive element R2. Accordingly, the voltage at node N1 will be greater than that at node N2 to provide a differential DC offset cancellation voltage among nodes N1 and N2. Such differential DC offset cancellation voltage among nodes N1 and N2 may cancel DC offset.

Figure 3:
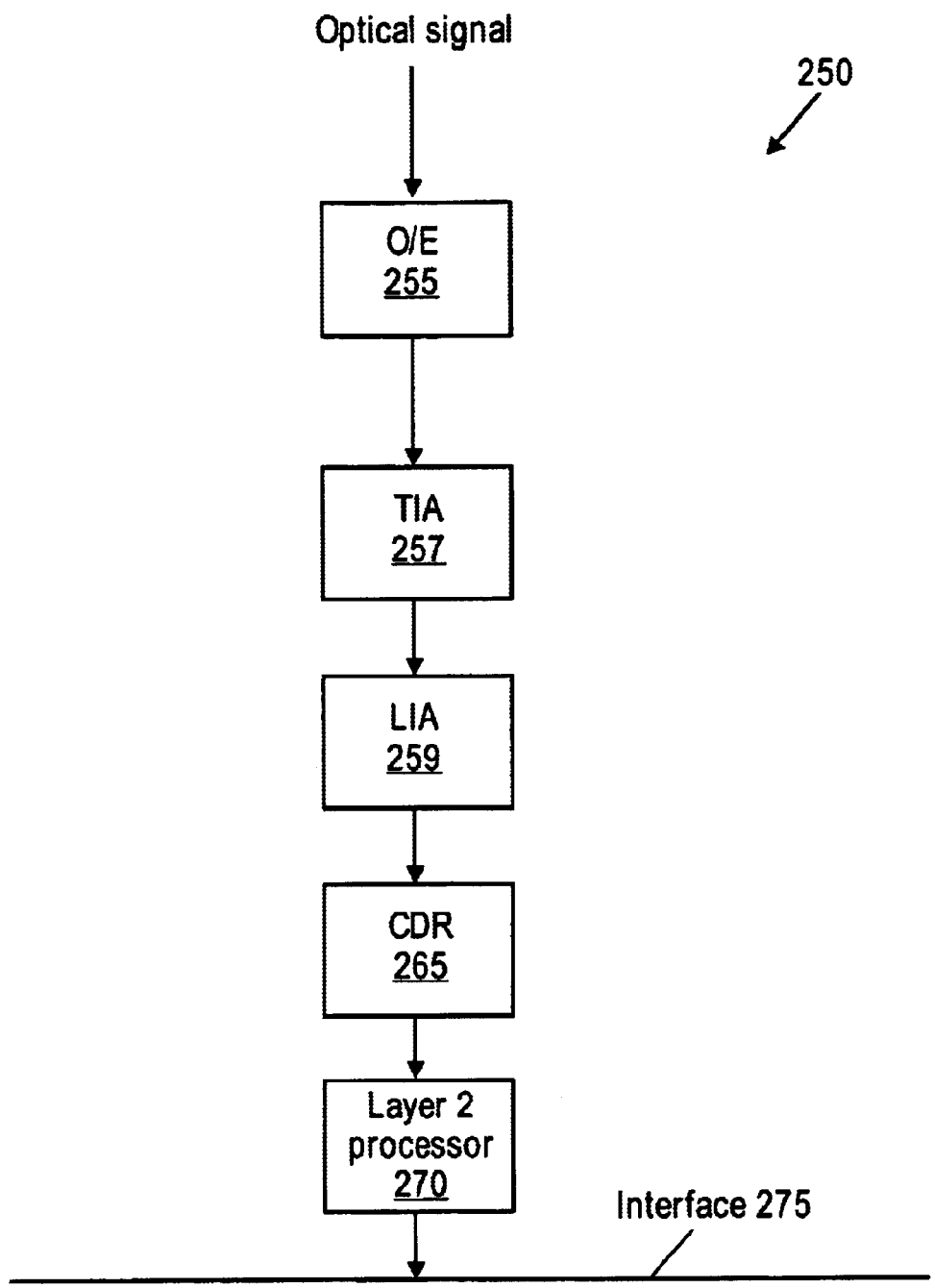
FIG. 3 shows a diagram of a system in which a LIA may be used in accordance with an embodiment of the present invention.

FIG. 3 shows a diagram of a receiver system 250 in which LIA 100 may be used in accordance with an embodiment of the present invention. Referring to FIG. 3, optical-to-electrical converter ("O/E") 255 may convert optical signals received from an optical network into electrical signals. Although reference has been made to optical signals, the receiver 250 may, in addition or alternatively, receive electrical signals from an electrical signal network or wireless or wire-line signals according to any standards. Transimpedance amplifier ("TIA") 257 may receive a small amplitude input current and provide a small amplitude output voltage. Limiting amplifier ("LIA") 259 may receive a small amplitude input voltage from the TIA 257 and may output a larger amplitude voltage signal but limit the range of output amplitudes. LIA 259 may utilize LIA 100 of FIG. 1.

Clock and data recovery unit ("CDR") 265 may re-time the electrical signals from LIA 259. With respect to the regenerated signals, layer two processor 270 may perform media access control (MAC) management in compliance for example with Ethernet, described for example in versions of IEEE 802.3; optical transport network (OTN) de-framing and de-wrapping in compliance for example with ITU-T G.709; forward error correction (FEC) processing, in accordance with ITU-T G.975; and/or other layer 2 processing.

Some implementations of receiver system 250 may utilize 10 Gigabit Attachment Unit Interface (XAUI), Serial Peripheral Interface (SPI), ten bit interface (TBI), and/or Gigabit Media Independent Interface (GMII) compliant interfaces (as well as interfaces based on related standards) to provide intercommunication between layer two processor 270 and the CDR 265.

Interface 275 may provide intercommunication between layer two processor 270 and other devices such as a microprocessor, memory devices (not depicted), packet processor (not indepicted), and/or a switch fabric (not depicted). Interface 275 may comply, for example, with Peripheral Component Interconnect (PCI), Universal Serial Bus (USB), Ethernet, IEEE 1394, and/or a vendor specific multi-source agreement (MSA) protocol.

Modification

The drawings and the forgoing description gave examples of the present invention. The present invention, however, is by no means limited by these specific examples. Numerous variations, whether explicitly given in the specification or not, such as differences in structure, dimension, and use of material, are possible. The scope of the invention is at least as broad as the following claims.

What is claimed is:

1. An apparatus comprising:
   an input stage comprising input terminals to receive an input signal and further comprising output terminals to provide an output signal;
   at least two offset cancellation devices each to provide a DC offset cancellation signal; and
   a selector device to selectively transfer a DC offset cancellation signal to the input stage from one of the at least two offset cancellation devices.

2. The apparatus of claim 1, wherein the selector device selects the transferred DC offset cancellation signal based on a pre-assigned priority among the at least two offset cancellation devices.

3. The apparatus of claim 1, wherein the selector device disables the output of offset cancellation devices other than the offset cancellation device having a transferred DC offset cancellation signal.

4. The apparatus of claim 1, wherein one of the at least two offset cancellation devices comprises a device that provides a DC offset cancellation signal having a fixed relationship with the output signal.

5. The apparatus of claim 1, wherein one of the at least two offset cancellation devices comprises a low pass filter to provide a DC average of the output signal as a DC offset cancellation signal.

6. The apparatus of claim 1, wherein one of the at least two offset cancellation devices comprises a device that provides a DC offset cancellation signal having a manually adjusted value.

7. The apparatus of claim 1, wherein one of the at least two offset cancellation devices comprises a manually tunable voltage source.

8. The apparatus of claim 1, wherein the input stage comprises:
   at least two input ports each associated with each of the at least two offset cancellation devices, wherein the selector device sets input signals to all input ports to zero except for an input signal to an input port associated with the offset cancellation device having the DC offset cancellation signal transferred by the selector device.

9. The apparatus of claim 1, wherein the selector device comprises:
   a selector port to receive a DC offset cancellation signal from a highest priority offset cancellation device and to transfer the DC offset cancellation signal from the highest priority offset cancellation device to the input stage; and
   a disabling output device to disable outputs from every offset cancellation device except for the highest priority offset cancellation device.

10. A method comprising:
    providing at least two DC offset cancellation signals;
    selectively transferring one of the provided DC offset cancellation signals based on a priority among the DC offset cancellation signals; and
    providing an output signal.

11. The method of claim 10, wherein the providing at least two DC offset cancellation signals comprises providing a DC offset cancellation signal having a fixed relationship with the output signal.

12. The method of claim 10, wherein the providing at least two DC offset cancellation signals comprises providing a DC offset cancellation signal having a manually adjusted value.

13. The method of claim 10, wherein the selectively transferring one of the provided DC offset cancellation signals comprises disabling the providing of DC offset cancellation signals other than the selectively transferred DC offset cancellation signal.

14. A system comprising:
    an input stage comprising input terminals to receive an input signal and further comprising output terminals to provide an output signal;
    at least two offset cancellation devices each to provide a DC offset cancellation signal;
    a selector device to selectively transfer a DC offset cancellation signal to the input stage from one of the at least two offset cancellation devices;

a clock and data recovery device to perform signal retiming on the output signal;

a layer two processor to receive the retimed output signals; and an interface device to receive signals from the layer two processor.

15. The system of claim 14, further comprising a XAUI compatible interface to couple the layer two processor with the interface device.

16. The system of claim 14, wherein the layer two processor comprises logic to perform media access control in compliance with IEEE 802.3.

17. The system of claim 14, wherein the layer two processor comprises logic to perform optical transport network de-framing in compliance with ITU-T G.709.

18. The system of claim 14, wherein the layer two processor comprises logic to perform forward error correction processing in compliance with ITU-T G.975.

19. The system of claim 14, further comprising a switch fabric coupled to the interface device.

20. The system of claim 14, further comprising a packet processor coupled to the interface device.

* * * * *